United States Patent
Gandhi et al.

(10) Patent No.: US 9,124,324 B2
(45) Date of Patent: Sep. 1, 2015

(54) DUAL LOOP DIGITAL PREDISTORTION FOR POWER AMPLIFIERS

(71) Applicant: Texas Instruments Incorporated, Dallas, TX (US)

(72) Inventors: Hardik Prakash Gandhi, Sunnyvale, CA (US); Zigang Yang, Plano, TX (US); Xiaohan Chen, Sunnyvale, CA (US); Raul Blazquez, Dallas, TX (US); Lars Jorgensen, Royal Oaks, CA (US); Hongzhi Zhao, Sunnyvale, CA (US); Jie Yang, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/679,603

(22) Filed: Apr. 6, 2015

(65) Prior Publication Data
US 2015/0214988 A1  Jul. 30, 2015

Related U.S. Application Data

(62) Division of application No. 13/852,333, filed on Mar. 28, 2013, now Pat. No. 9,001,928.

(51) Int. Cl.
| | |
|---|---|
| *H04K 1/02* | (2006.01) |
| *H04L 25/03* | (2006.01) |
| *H04L 25/49* | (2006.01) |
| *H04B 1/04* | (2006.01) |
| *H04L 27/26* | (2006.01) |

(52) U.S. Cl.
CPC .......... *H04B 1/0475* (2013.01); *H04L 27/2614* (2013.01); *H04B 2001/045* (2013.01); *H04B 2001/0416* (2013.01)

(58) Field of Classification Search
CPC .............. H04B 1/0475; H04B 2001/0416; H04B 2001/045; H04L 27/2614
USPC .......................................... 375/297
See application file for complete search history.

(56) References Cited

U.S. PATENT DOCUMENTS

| | | | |
|---|---|---|---|
| 8,446,979 B1 * | 5/2013 | Yee ................................ | 375/296 |
| 2006/0291584 A1 * | 12/2006 | Dittmer ........................ | 375/296 |
| 2009/0310710 A1 * | 12/2009 | Farrokhi ...................... | 375/302 |
| 2011/0064155 A1 * | 3/2011 | Ashita .......................... | 375/260 |
| 2012/0286863 A1 * | 11/2012 | Gandhi et al. ............... | 330/149 |
| 2012/0321018 A1 * | 12/2012 | Chen et al. ................... | 375/296 |
| 2014/0294120 A1 * | 10/2014 | Gandhi et al. ............... | 375/297 |

* cited by examiner

*Primary Examiner* — Erin File
(74) *Attorney, Agent, or Firm* — Lawrence J. Bassuk; Frank D. Cimino

(57) ABSTRACT

A method of predistorting an input signal (902) for an amplifier is disclosed (FIG. 9). The method includes predistorting the input signal with a first set of parameters (FDPD) and a second set of parameters (CDPD) at a first time (904). The first set of parameters is updated at a second time (914). The second set of parameters is updated separately from the first set of parameters at a third time (920).

10 Claims, 9 Drawing Sheets

DUAL LOOP DIGITAL PREDISTORTION FOR POWER AMPLIFIERS

This application is a divisional of prior application Ser. No. 13/852,333, filed Mar. 28, 2013, now U.S. Pat. No. 9,001,928, granted Apr. 7, 2015.

BACKGROUND OF THE INVENTION

Embodiments of the present invention relate to wireless communication systems and, more particularly, to digital predistortion (DPD) of power amplifier input signals.

Orthogonal Frequency Division Multiplex (OFDM) transmission is widely used in wireless communication systems. With OFDM, multiple tones are passed through an Inverse Fast Fourier Transform (IFFT) to create a time domain signal. The time domain signal is subsequently amplified by a power amplifier and transmitted from a base station (BST) to user equipment (UE) within the wireless network. FIG. 1 shows an exemplary wireless telecommunications network 100 of the prior art. The illustrative telecommunications network includes BST 102, UE 106, and UE 108. BST 102 communicates with internet protocol (IP) network 104 through a wired or wireless telecommunications network. BST 102 subsequently communicates with UEs 106 and 108, which may be cell phones, laptop or tablet computers, internet hot spots, or other wireless network devices.

The power amplifier of BST 102 is typically designed to operate near saturation to achieve maximum efficiency. The transfer function of the power amplifier near saturation, however, is highly nonlinear. In order to compensate for this nonlinearity, input signals of the power amplifier are often predistorted. Referring to FIG. 2A, there is a diagram of digital predistortion (DPD) block 200 and power amplifier 204. A digital input signal $V_1$ is initially applied to DPD block 200. DPD block 200 predistorts $V_1$ to produce output $V_P = F(V_1)$ as shown at curve 202. Here, the horizontal and vertical axes of curves 202 and 206 are time and amplitude, respectively. $V_P$ is approximately the inverse of the transfer function of power amplifier 204 as shown at curve 206. The resulting output signal $V_O = F(V_1) \cdot G(V_P)$ from power amplifier 204, therefore, is approximately linear as shown at curve 208.

Referring now to FIG. 2B, there is a diagram illustrating the concept of predistortion of power amplifier 204, where the horizontal axis is input power and the vertical axis is output power. At low input and output power, the power amplifier operates in a linear region. As input and output power increase to $P_{IN}$ and $P_{OUT}$ 210, respectively, the power amplifier begins to operate in saturation. If uncompensated, operation in saturation causes several problems illustrated by the diagram of FIG. 2C. The desired output characteristic of the power amplifier is curve 220, where the horizontal axis is frequency and the vertical axis is amplitude. However, nonlinear operation in saturation produces adjacent channel interference 224, and a higher adjacent channel power ratio (ACPR) or adjacent channel leakage ratio (ACLR). There are also an in band degraded error vector magnitude (EVM) 222 and third 224 and fifth 226 order intermodulation distortion problems. As input power $P_{IN}$(DPD) and output power $P_{OUT}$(DPD) of power amplifier 204 increase 212, operation without compensation becomes impractical. With DPD, however, input power is compensated to produce output power 214 in the linear region and reduce problems of FIG. 2C.

Referring now to FIG. 3, there is a Doherty power amplifier of the prior art which is representative of power amplifier 204. The Doherty amplifier includes a carrier amplifier 302 biased to operate in class AB mode and a peaking amplifier 308 biased to operate in class C mode. The carrier amplifier receives $RF_{IN}$ through circuit 300, having an input coupling factor $CF_I$. $RF_{IN}$ is phase shifted by 90° through circuit 306 and applied to peaking amplifier 308. The output of carrier amplifier 302 is phase shifted by 90° through circuit 304 and applied to circuit 310, having an output coupling factor $CF_O$. Circuit 310 combines the output signals from carrier amplifier 302 and peaking amplifier 308 to produce RF output signal $RF_{OUT}$. The Doherty amplifier is inherently nonlinear due to the two separate amplifiers as well as their respective nonlinear components. Effective digital predistortion requires accurate and detailed modeling of both amplifiers 302 and 308 as well as coupling circuits 300 and 310, phase shift circuits 304 and 306, all components, parasitic coupling of wired interconnect, and any imperfections in power supply networks for transistor drain and gate biasing. Many of the parameters associated with the power amplifier model are dependent on transmit power, operating frequency, semiconductor device temperature and many other factors. Moreover, many of these parameters change over time and must be updated to maintain accurate DPD compensation. However, iteratively updating these parameters is computationally time consuming and may not closely follow rapid changes in the input signal.

While the preceding approaches provide steady improvements in DPD of power amplifiers, the present inventors recognize that still further improvements are possible. Accordingly, the preferred embodiments described below are directed toward improving upon the prior art.

BRIEF SUMMARY OF THE INVENTION

In a preferred embodiment of the present invention, there is disclosed a method of predistorting an input signal for an amplifier. The method includes predistorting the input signal with a first and a second set of parameters at a first time. The first set of parameters is updated at a second time. The second set of parameters is updated separately from the first set of parameters at a third time.

DETAILED DESCRIPTION OF THE INVENTION

Figure 1:
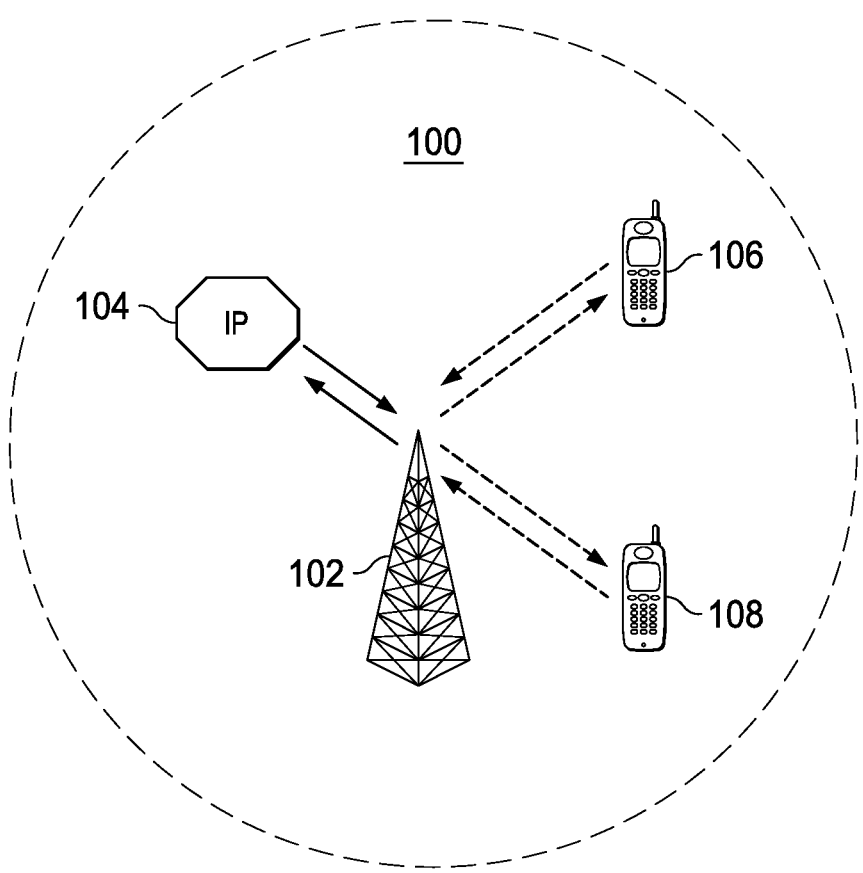
FIG. 1 is a diagram of a wireless communication system of the prior art.
Figure 2A:
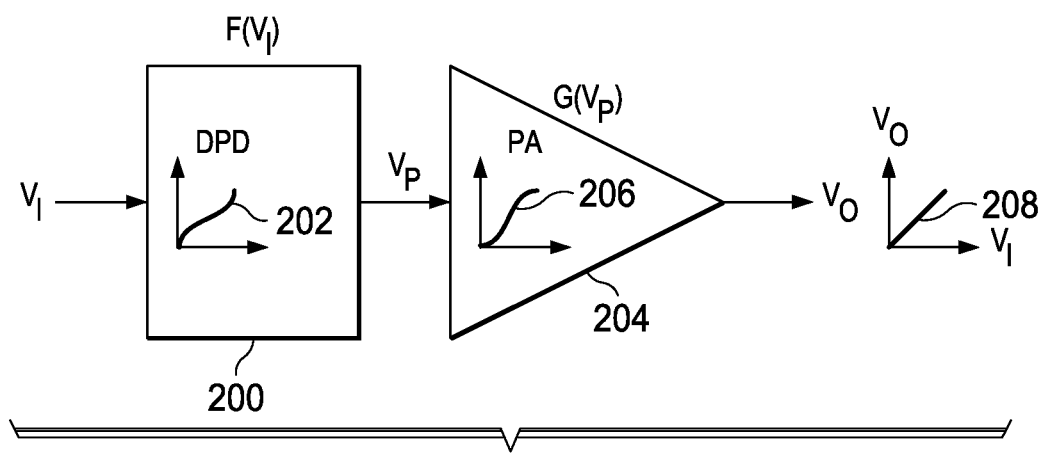
FIGS. 2A-2C are diagrams illustrating the concept of digital predistortion (DPD) of the prior art.
Figure 2B:
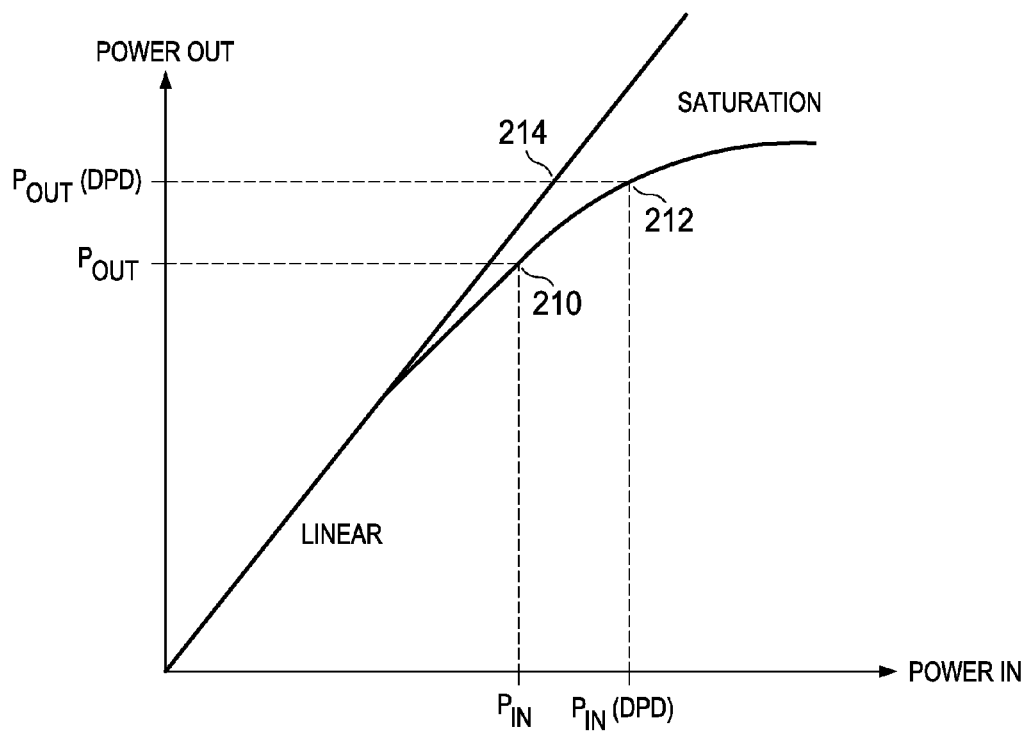
Figure 2C:
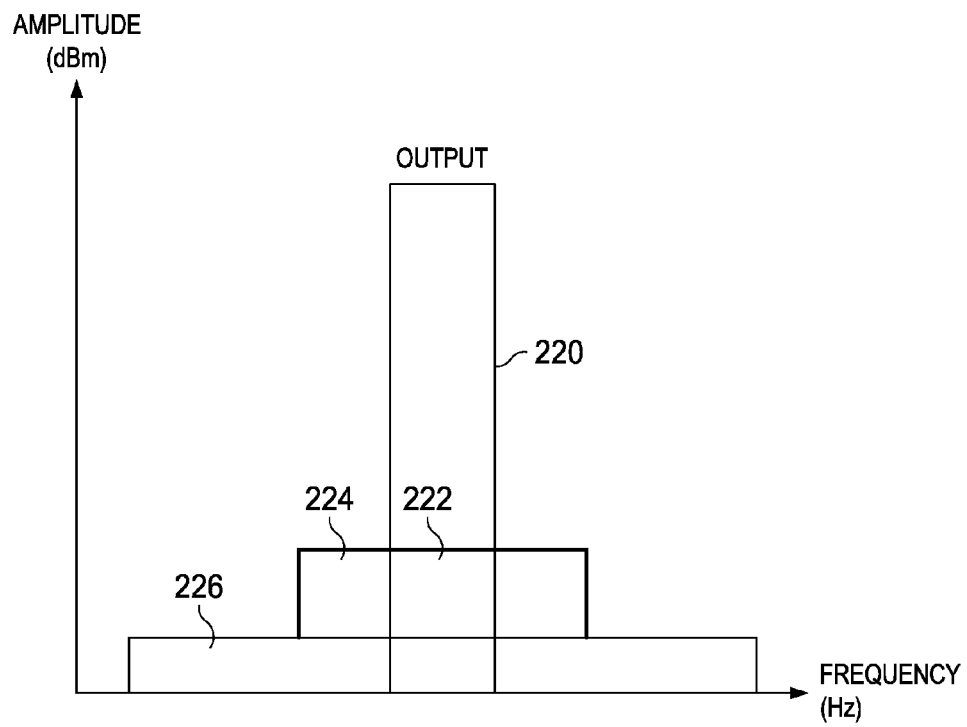
Figure 3:
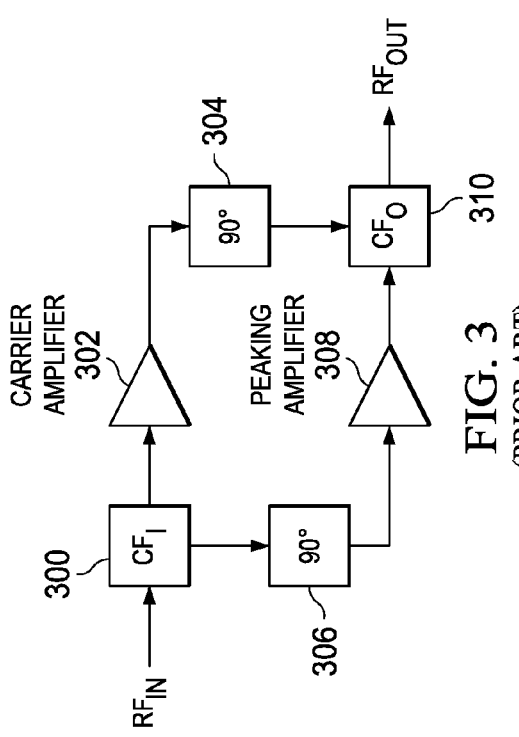
FIG. 3 is a diagram of a Doherty power amplifier of the prior art which may be used with DPD.
Figure 4:
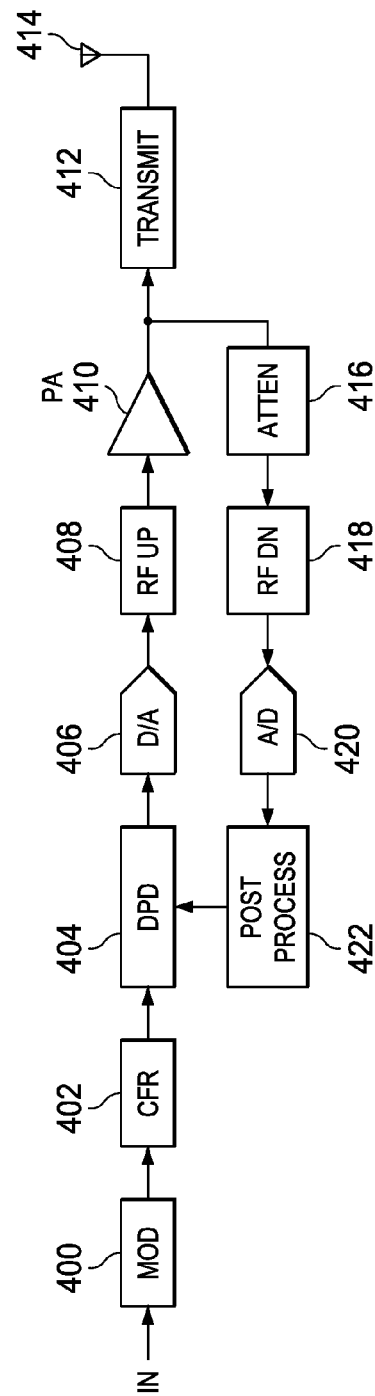
FIG. 4 is a simplified block diagram of a base station transmitter according to the present invention.

Referring to FIG. 4, there is a block diagram of a transmitter according to the present invention. Here and in the following description, it is to be understood that some circuits may be realized in hardware or in software and could be implemented with discrete time circuits (digital hardware) or continuous time circuits (analog hardware). Furthermore, the same reference numerals are used in the following description to indicate substantially similar circuit elements. The transmitter includes a modulation circuit 400 coupled to receive a digital input signal (IN). The modulation circuit 400 preferably produces an orthogonal frequency division multiplex (OFDM) signal which is applied to crest factor reduction (CFR) circuit 402. Modulation circuit 400 could alternatively produce a spread-spectrum signal or any other modulation. If using OFDM, the modulated signal is a time domain signal produced by an inverse Fast Fourier Transform (IFFT) from frequency domain tones. The composite time domain signal, however, may include several constructively reinforced signals from the IFFT having spurious high amplitude peaks. These high amplitude peaks create a high peak-to-average power ratio (PAPR) that degrades operation of a power amplifier. Even with other types of modulation, multi-carrier signals can exhibit high PAPR. Several techniques have been developed to reduce the PAPR such as the one disclosed by the present inventors in U.S. patent application Ser. No. 12/957,278, filed Nov. 30, 2010, and incorporated by reference herein in its entirety.

The output of CFR circuit 402 is applied to digital predistortion (DPD) circuit 404 to predistort the input signal prior to amplification as will be discussed in detail. The predistorted signal from DPD circuit 404 is applied to digital-to-analog (D/A) circuit 406. The resulting analog signal is up converted to radio frequency by RF UP circuit 408 and applied to power amplifier 410. The amplified RF signal is applied to transmitter 412 and subsequently transmitted by antenna 414, which may be an array of antennas. A sample of the output signal from power amplifier 410 is received and attenuated by circuit 416. The attenuated signal is then down converted by RF DN circuit 418 to produce a baseband analog feedback signal. The baseband analog signal is applied to analog-to-digital converter 420 to produce a digital feedback signal. Post process circuit 422 receives the digital feedback signal and performs equalization gain correction and nonlinear correction due to distortion from the feedback path. Post process circuit 422 then applies a corrected feedback signal to DPD circuit 404 where it is used to update DPD parameters as will be discussed in detail. In an alternative embodiment of the present invention, the attenuated signal from block 416 may be converted to an intermediate frequency (IF) by RF DN circuit 418 and down converted by post process circuit 422 to produce a baseband digital feedback signal.

Figure 5A:
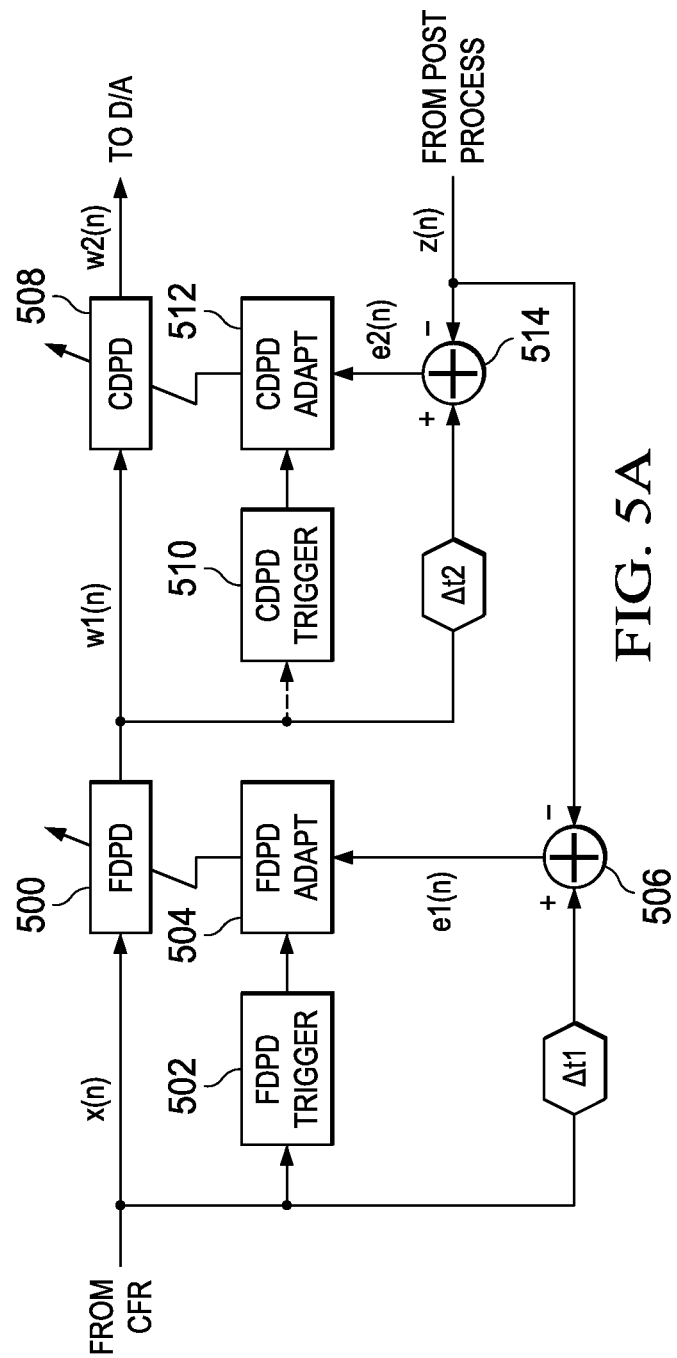
FIG. 5A is a detailed block diagram of a first embodiment of DPD circuit 404 of FIG. 4.

Turning now to FIG. 5A, there is a detailed block diagram of a first embodiment of DPD circuit 404. This embodiment employs a cascade architecture with direct learning architecture for updating the DPD parameters. Here and in the following discussion, direct learning means updating DPD parameters in response to an error signal between the DPD input signal and the feedback signal. The circuit includes a first digital predistortion (FDPD or fine DPD) circuit 500 coupled to receive an input signal x(n) from CFR circuit 402. Here, (n) preferably indicates a digitized complex sample of an n-length data vector, where n is a positive integer. FDPD circuit 500 produces a first output signal $w1(n)$ in response to the input signal x(n) employing a first set of digital predistortion parameters as will be described in detail. A second digital predistortion (CDPD or coarse DPD) circuit 508 is coupled to receive output signal $w1(n)$ and produce a second output signal $w2(n)$ in response to $w1(n)$ employing a second set of digital predistortion parameters as will be described in detail. The second output signal is applied to D/A circuit 406 and amplified as previously described.

A feedback signal z(n) is received from post process circuit 422 and applied to sum circuits 506 and 514. Sum circuit 506 subtracts the feedback signal z(n) from the appropriately delayed (Δt1) input signal x(n) to produce a first error signal $e1(n)$. Error signal $e1(n)$ is applied to an update circuit comprising FDPD trigger circuit 502 and FDPD adaptation circuit 504. FDPD trigger circuit 502 is coupled to receive input signal x(n) and serves to trigger or initiate operation of FDPD adaptation circuit 504 in response to a fine or fast change of input signal x(n). This fine or fast change is preferably due to a change in amplitude or frequency of x(n) or rapid changes in PA operating conditions. When FDPD trigger circuit 502 indicates, FDPD adaptation circuit 504 updates the first set of digital predistortion parameters of FDPD circuit 500 in response to error signal $e1(n)$. The update process is preferably an error minimizing least squares or similar iterative algorithm performed by a digital signal processor. It produces an updated set of first parameters related to changes in power, frequency, operating temperature, or other quickly changing parameters of the power amplifier. These first parameters are a relatively small subset of the total set of DPD parameters and may be quickly updated in response to rapid changes in the input signal x(n).

Feedback signal z(n) from post process circuit 422 is also applied to sum circuit 514. Sum circuit 514 subtracts the feedback signal z(n) from the appropriately delayed (Δt2) first output signal $w1(n)$ to produce a second error signal $e2(n)$. Error signal $e2(n)$ is applied to a second update circuit comprising CDPD trigger circuit 510 and CDPD adaptation circuit 512. CDPD trigger circuit 510 may be optionally coupled to receive output signal $w1(n)$ to trigger or initiate operation of CDPD adaptation circuit 512 in response to a coarse or slow change of output signal $w1(n)$ with respect to a predetermined threshold as indicated by the dashed line. Alternatively, CDPD trigger circuit 510 may activate CDPD adaptation circuit 512 in response to a counter or timed software interrupt. In this manner, CDPD adaption circuit 512 is preferably activated much less frequently than FDPD adaption circuit 504. When CDPD trigger circuit 510 indicates, CDPD adaptation circuit 512 updates the second set of digital predistortion parameters of CDPD circuit 508 in response to error signal $e2(n)$. The update process is preferably an error minimizing least squares or other similar iterative adaptation algorithm performed by a digital signal processor. It produces an updated set of second parameters related to changes in impedance or component mismatch, aging, intermodulation distortion, or other slowly changing parameters of the power amplifier.

The second set of parameters of CDPD circuit 508 is substantially larger than the first set of parameters of FDPD circuit 500. Moreover, the second set of parameters may be updated separately and less frequently than the first set of parameters. For example, the first set of parameters in FDPD circuit 500 may be updated every 100 microseconds while the second set of parameters may be updated within a time frame of 100 milliseconds to 10 seconds. This is highly advantageous in providing a reduced first set of DPD parameters in FDPD circuit 500 that may be updated quickly to track rapid changes in the input signal or PA operating conditions. Moreover, a much larger second set of DPD parameters in CDPD circuit 508 are updated much less frequently to maintain accuracy of the DPD process yet greatly reduce time for parameter computation and update.

Figure 5B:
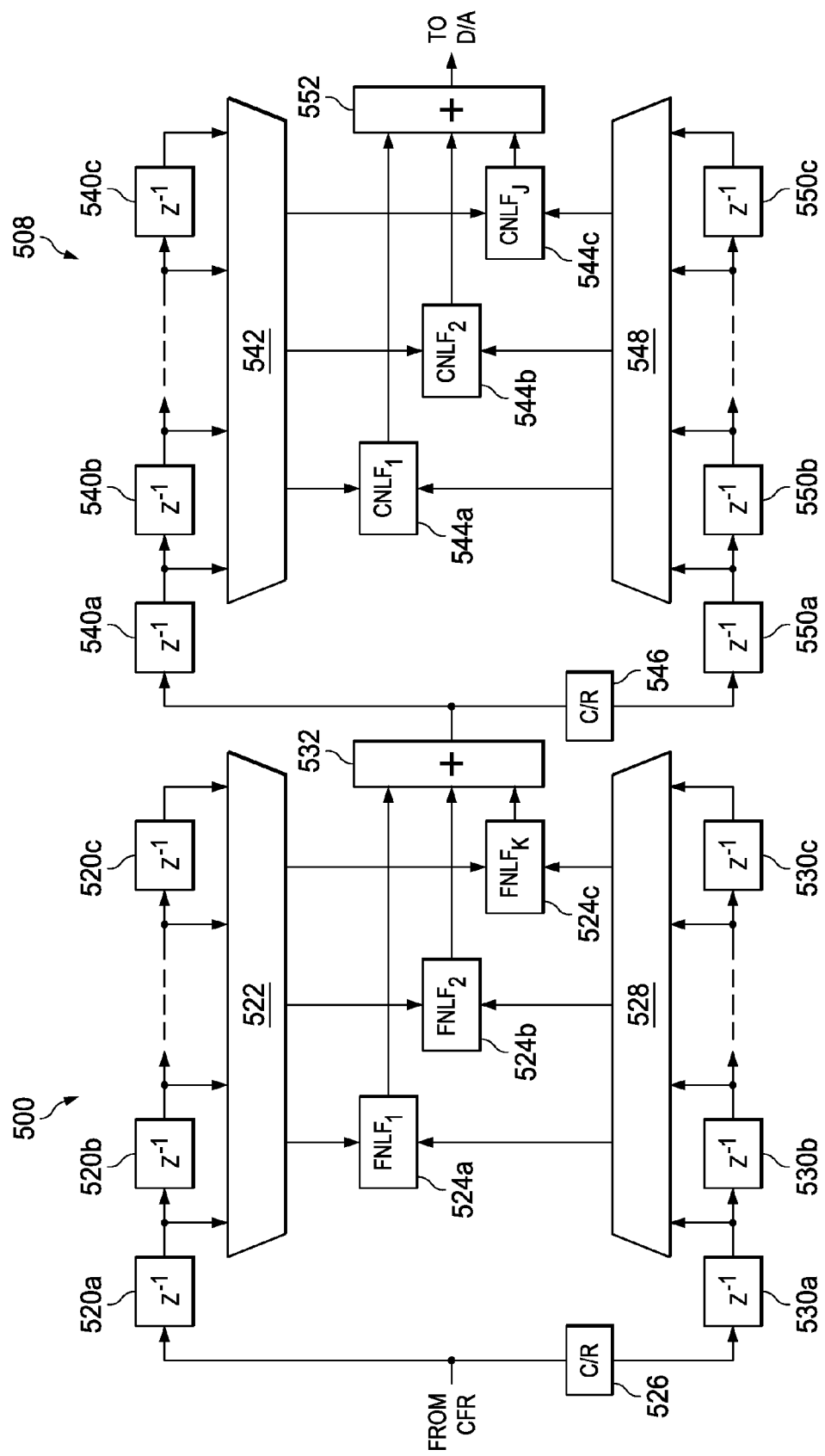
FIG. 5B is a detailed block diagram of fine digital predistortion (FDPD) circuit 500 and coarse digital predistortion (CDPD) circuit 508 of FIG. 5A.

Referring now to FIG. 5B, there is a detailed block diagram of fine digital predistortion (FDPD) circuit 500 and coarse digital predistortion (CDPD) circuit 508 of FIG. 5A. Each of FDPD circuit 500 and CDPD circuit 508 is similar to a DPD circuit disclosed by the present inventors in U.S. Pat. No. 8,306,149, filed Oct. 1, 2009, and incorporated by reference herein in its entirety. FDPD circuit 500 includes a delay line 520a through 520c coupled to receive complex input signal x(n) and having output taps applied to multiplex circuit 522. A complex-to-real (C/R) circuit 526 is also coupled to receive complex input signal x(n) and produce a real output signal that is preferably a square of the magnitude of x(n). The real output signal is applied to delay line 530a through 530c having output taps applied to multiplex circuit 528. Multiplex circuits 522 and 528 apply respective output signals to K fine nonlinear function circuits 524a through 524c, where K is a positive integer. The fine nonlinear function circuits 524a through 524c are preferably implemented as a look up table, a polynomial, or a combination of the two. Signals from multiplex circuit 528 select the first set of FDPD digital predistortion parameters, which are subsequently multiplied by the signals from multiplex circuit 522. Resulting output signals from the fine nonlinear function circuits are applied to sum circuit 532 to produce K Volterra terms as in equation [1], where nr is the number of real taps from delay line 520a through 520c and nc is the number of complex taps from delay line 530a through 530c.

$$ys_1(n) = \sum_{k=1}^{K} FNLF_k(|x(n-m_k)|^2, x(n-l_k)), \quad [1]$$

$$m_k \in [0, nc_1), l_k \in [0, nr_1)$$

CDPD circuit 508 includes a delay line 540a through 540c coupled to receive the output signal from sum circuit 532 and having output taps applied to multiplex circuit 542. A complex-to-real (C/R) circuit 546 is also coupled to receive the output signal from sum circuit 532 and produce a real output signal. The real output signal is applied to delay line 550a through 550c having output taps applied to multiplex circuit 548. Multiplex circuits 542 and 548 apply respective output signals to J coarse nonlinear function circuits 544a through 544c, where J is a positive integer. The coarse nonlinear function circuits 544a through 544c may also be preferably implemented as a look up table, a polynomial, or a combination of the two. Signals from multiplex circuit 548 select the second set of CDPD digital predistortion parameters, which are subsequently multiplied by signals from multiplex circuit 542. Resulting output signals from the coarse nonlinear function circuits are applied to sum circuit 552 to produce J Volterra terms as in equation[2], where nr is the number of real taps from delay line 540a through 540c and nc is the number of complex taps from delay line 550a through 550c. These Volterra terms are then applied to D/A circuit 406 as previously discussed.

$$ys_2(n) = \sum_{j=1}^{J} CNLF_j(|ys_1(n-m_j)|^2, ys_1(n-l_j)), \quad [2]$$

$$m_j \in [0, nc_2), l_j \in [0, nr_2)$$

Figure 6A:
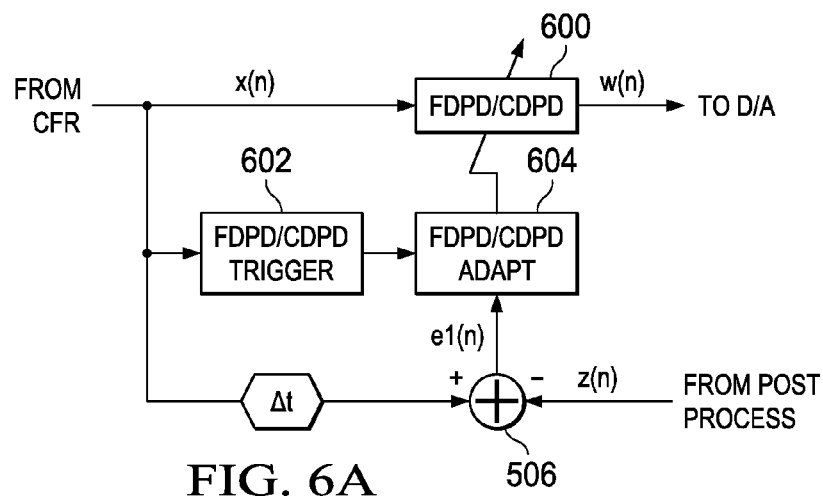
FIG. 6A is a detailed block diagram of a second embodiment of DPD circuit 404 of FIG. 4.

Turning now to FIG. 6A, there is a detailed block diagram of a second embodiment of DPD circuit 404. This embodiment employs a parallel architecture with direct learning architecture for updating of the DPD parameters. The circuit includes a first and a second digital predistortion (FDPD/CDPD) circuit 600 connected in parallel and coupled to receive input signal x(n). The combined FDPD/CDPD circuit 600 produces an output signal w(n) in response to the input signal x(n) and first and second sets of digital predistortion parameters as will be described in detail. The output signal is applied to D/A circuit 406 and amplified as previously described.

A feedback signal z(n) is received from post process circuit 422 and applied to sum circuit 506. Sum circuit 506 subtracts the feedback signal z(n) from the appropriately delayed (Δt) input signal x(n) to produce a first error signal e1($n$). Error signal e1($n$) is applied to an update circuit comprising FDPD/CDPD trigger circuit 602 and FDPD/CDPD adaptation circuit 604. FDPD/CDPD trigger circuit 602 is coupled to receive input signal x(n) and serves to trigger or initiate operation of FDPD/CDPD adaptation circuit 604. The combined FDPD/CDPD trigger circuit 602 preferably operates in the same manner as previously described with regard to FDPD trigger circuit 502 and CDPD trigger circuit 510. Likewise, the combined FDPD/CDPD adaptation circuit 604 preferably operates in the same manner as previously described with regard to FDPD adaptation circuit 504 and CDPD adaptation circuit 512. In other words, the FDPD portion of the circuit is activated in response to a fine or fast change of input signal x(n) or PA operating conditions. The CDPD portion of the circuit may be activated in response to a coarse or slow change of input signal x(n). Alternatively, the CDPD portion of the circuit may be activated separately from the FDPD portion by a counter or timed interrupt signal. In yet another embodiment of the present invention, the FDPD portion of adaptation circuit 604 is activated in response to a fine or fast change of input signal x(n) or PA operating conditions. However, both FDPD and CDPD portions of adaptation circuit 604 are activated in response to a coarse or slow change of input signal x(n).

When the FDPD/CDPD trigger circuit 602 indicates, the FDPD portion of adaptation circuit 604 updates the first set of fine digital predistortion parameters of FDPD/CDPD circuit 600 in response to error signal e1($n$). The update process is preferably an error minimizing least squares type iterative adaptation algorithm performed by a digital signal processor that produces an updated set of first parameters related to changes in power, frequency, and operating temperature of the power amplifier. These first parameters are a subset of the total set of DPD parameters and may be quickly updated in response to rapid changes in the input signal x(n). Correspondingly, when the FDPD/CDPD trigger circuit 602 indicates, the CDPD portion of adaptation circuit 604 updates the second set of coarse digital predistortion parameters of FDPD/CDPD circuit 600 in response to error signal e1($n$). The update process is also preferably an error minimizing least squares type iterative adaptation algorithm that produces an updated set of second parameters related to changes in impedance or component mismatch, aging, passive intermodulation distortion, and other slowly changing parameters of the power amplifier.

Figure 6B:
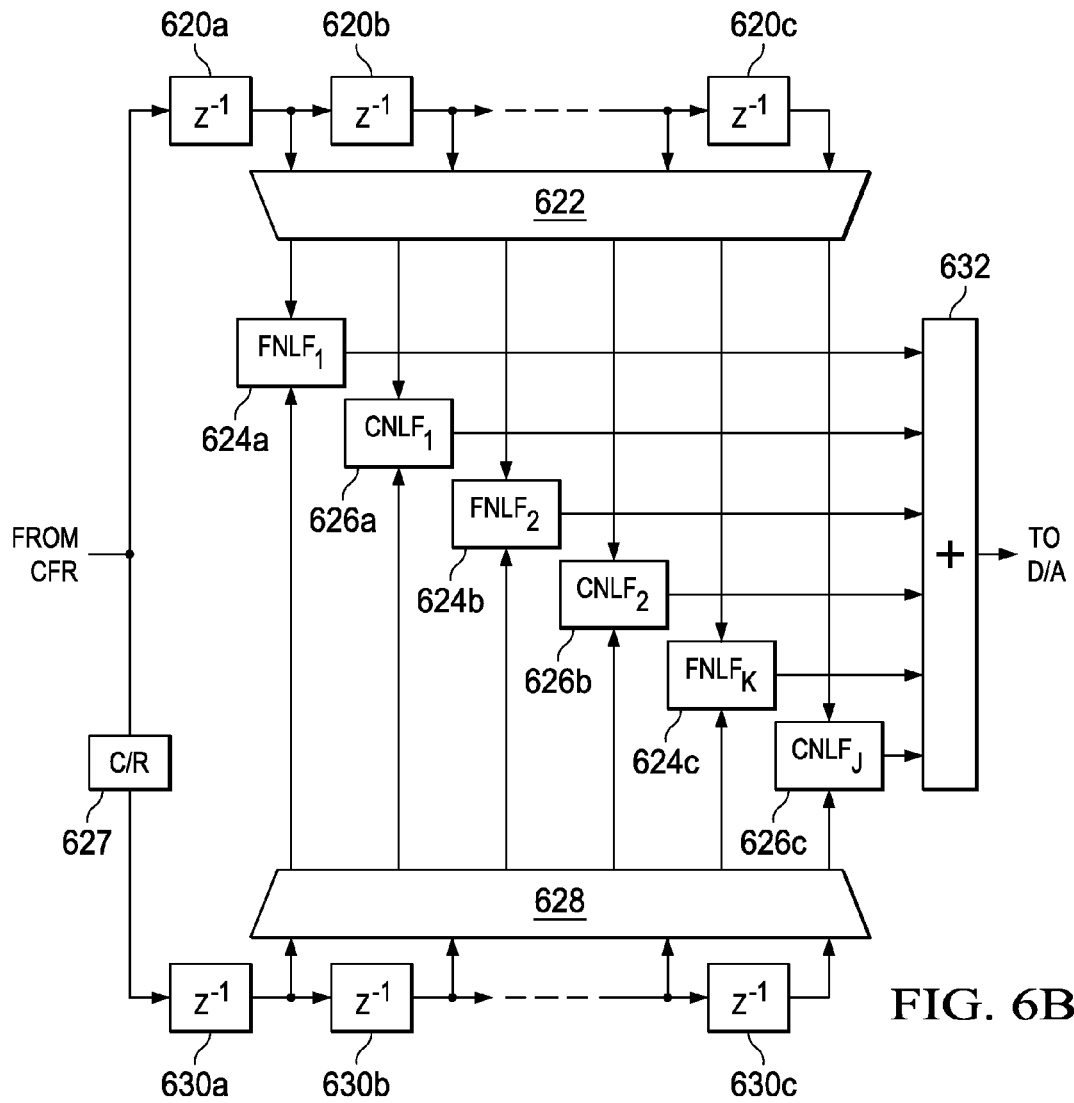
FIG. 6B is a detailed block diagram of fine and coarse digital predistortion (FDPD/CDPD) circuit 600 of FIG. 6A.

Referring now to FIG. 6B, there is a detailed block diagram of FDPD/CDPD circuit 600 of FIG. 6A. FDPD/CDPD circuit 600 includes a delay line 620a through 620c coupled to receive complex input signal x(n) and having output taps applied to multiplex circuit 622. A complex-to-real (C/R) circuit 627 is also coupled to receive complex input signal x(n) and produce a real output signal that is preferably a square of the magnitude of x(n). The real output signal is applied to delay line 630a through 630c having output taps applied to multiplex circuit 628. Multiplex circuits 622 and 628 apply respective output signals to fine nonlinear function circuits 624a through 624c and coarse nonlinear function circuits 626a through 626c. Both fine and coarse nonlinear function circuits are preferably implemented as a look up table, a polynomial, or a combination of the two. Signals from multiplex circuit 628 select FDPD and CDPD digital predistortion parameters, which are subsequently multiplied by signals from multiplex circuit 622. Resulting output signals from the nonlinear function circuits are applied to sum circuit 632 to produce (K+J) Volterra terms as previously described. These Volterra terms are then applied to D/A circuit 406 as previously discussed.

Figure 7:
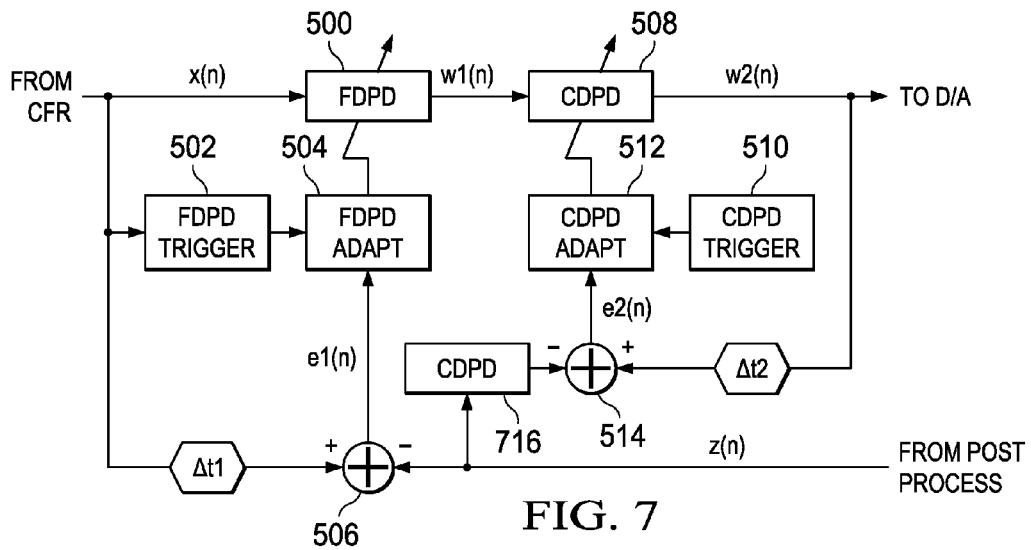
FIG. 7 is a detailed block diagram of a third embodiment of DPD circuit 404 of FIG. 4.

Referring next to FIG. 7, there is a detailed block diagram of a third embodiment of DPD circuit 404. This embodiment employs a cascade architecture with direct and indirect learning architecture for updating the DPD parameters. Here and in the following discussion, indirect learning means updating DPD parameters in response to an error signal between the DPD output signal and the compensated feedback signal. The circuit includes FDPD circuit 500 coupled to receive an input signal x(n) from CFR circuit 402. FDPD circuit 500 produces a first output signal $w1(n)$ in response to the input signal x(n) and a first set of digital predistortion parameters as previously described. CDPD circuit 508 is coupled to receive output signal $w1(n)$ and produce a second output signal $w2(n)$ in response to $w1(n)$ and a second set of digital predistortion parameters as previously described. The second output signal is applied to D/A circuit 406 and amplified.

A feedback signal z(n) is received from post process circuit 422 and applied to sum circuit 506. Sum circuit 506 subtracts the feedback signal z(n) from the appropriately delayed ($\Delta t1$) input signal x(n) to produce a first error signal $e1(n)$. Error signal $e1(n)$ is applied to an update circuit comprising FDPD trigger circuit 502 and FDPD adaptation circuit 504. FDPD trigger circuit 502 is coupled to receive input signal x(n) and serves to trigger or initiate operation of FDPD adaptation circuit 504 in response to a fine or fast change of input signal x(n). When FDPD trigger circuit 502 indicates, FDPD adaptation circuit 504 updates the first set of digital predistortion parameters of FDPD circuit 500 in response to error signal $e1(n)$. The update process is preferably an error minimizing least squares type iterative adaptation algorithm that produces an updated set of first parameters related to changes in power, frequency, and operating temperature of the power amplifier. These first parameters are a subset of the total set of DPD parameters and may be quickly updated in response to rapid changes in the input signal x(n).

Feedback signal z(n) from post process circuit 422 is also applied to CDPD circuit 716. CDPD circuit 716 is preferably a copy of CDPD circuit 508 and removes the previous second set of CDPD parameters added by CDPD circuit 508 from the feedback signal to produce a compensated feedback signal. Sum circuit 514 subtracts the output signal of CDPD circuit 716 from the appropriately delayed ($\Delta t2$) second output signal $w2(n)$ to produce a second error signal $e2(n)$. Error signal $e2(n)$ is applied to a second update circuit comprising CDPD trigger circuit 510 and CDPD adaptation circuit 512. CDPD trigger circuit 510 may be optionally coupled to receive output signal $w1(n)$ or $w2(n)$ to trigger or initiate operation of CDPD adaptation circuit 512 in response to a coarse or slow change of the respective output signal with respect to a predetermined threshold. Alternatively, CDPD trigger circuit 510 may activate CDPD adaptation circuit 512 in response to a counter or timed software interrupt. In this manner, CDPD adaption circuit 512 is preferably activated much less frequently than FDPD adaption circuit 504. When CDPD trigger circuit 510 indicates, CDPD adaptation circuit 512 updates the second set of digital predistortion parameters of CDPD circuit 508 in response to error signal $e2(n)$. The update process is preferably an error minimizing least squares type iterative adaptation algorithm that produces an updated set of second parameters related to changes in impedance or component mismatch, aging, intermodulation distortion, and other slowly changing parameters of the power amplifier.

The second set of parameters of CDPD circuit 508 is substantially larger than the first set of parameters of FDPD circuit 500. Moreover, the second set of parameters may be updated separately and less frequently than the first set of parameters. For example, the first set of parameters in FDPD circuit 500 may be updated every 100 microseconds while the second set of parameters may be updated within a time frame of 100 milliseconds to 10 seconds. This is highly advantageous in providing a reduced first set of DPD parameters in FDPD circuit 500 that may be updated quickly to track rapid changes in the input signal. Moreover, a much larger second set of DPD parameters in CDPD circuit 508 are updated much less frequently to maintain accuracy of the DPD process yet greatly reduce time for parameter computation and update.

Figure 8:
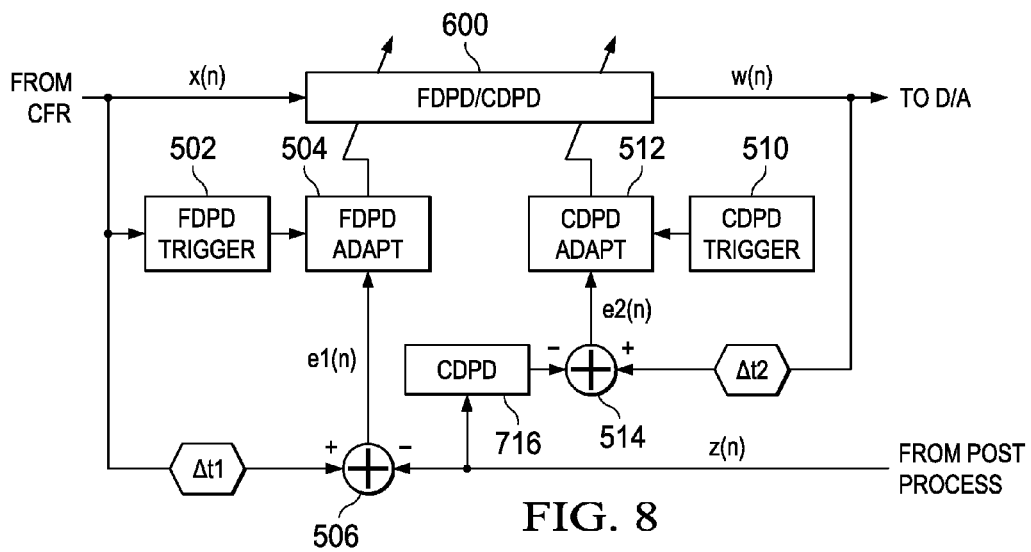
FIG. 8 is a detailed block diagram of a fourth embodiment of DPD circuit 404 of FIG. 4.

Referring now to FIG. 8, there is a detailed block diagram of a fourth embodiment of DPD circuit 404. This embodiment employs a parallel architecture with direct or indirect learning options for updating the DPD parameters. This embodiment of the present invention is the same as the embodiment of FIG. 7 except that FDPD circuit 500 and CDPD circuit 508 are combined in parallel FDPD/CDPD circuit 600 as previously described at FIG. 6A. As such, the embodiment of FIG. 8 includes all the advantages previously discussed with regard to FIGS. 5A and 6A.

Figure 9:
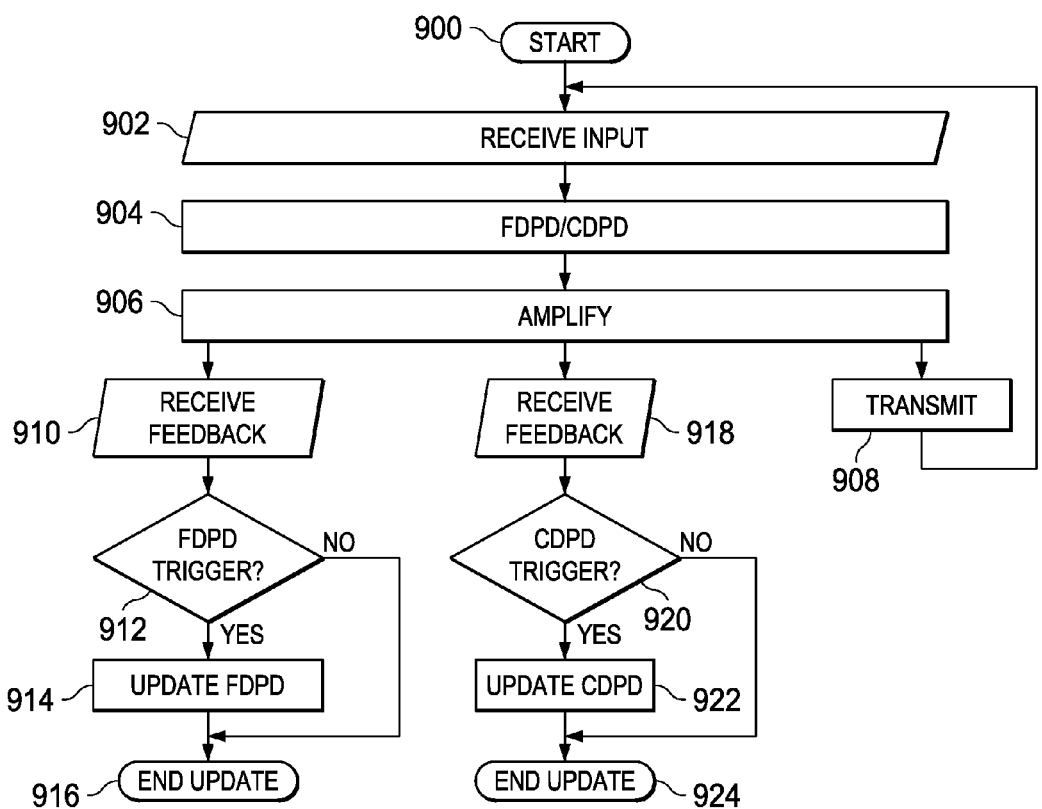
FIG. 9 is a flow chart showing operation of DPD circuits of the present invention.

Turning now to FIG. 9, there is a flow chart illustrating operation of the first four DPD embodiments of the present invention. Operation begins at block 900. Input signal x(n) is received at block 902. Both FDPD and CDPD are performed on the input signal at block 904. The predistorted input signal is subsequently amplified by power amplifier 410 at block 906 and transmitted at block 908. The return arrow to receive input block 902 indicates processing a continuous data stream. The amplified signal from block 906 is received as feedback at block 910. If the FDPD trigger is set at decision block 912, FDPD parameters are updated at block 914 and the update branch is terminated at block 916 until the next feedback signal is received. If the FDPD trigger is not set, FDPD parameters are not updated and the FDPD update branch is terminated at block 916 until the next feedback signal is received. The amplified signal from block 906 is also received as feedback at block 918. If the CDPD trigger is set at decision block 920, CDPD parameters are updated at block 922 and the update branch is terminated at block 924 until the next feedback signal is received. If the CDPD trigger is not set, CDPD parameters are not updated and the CDPD update branch is terminated at block 924 until the next feedback signal is received.

Figure 10A:
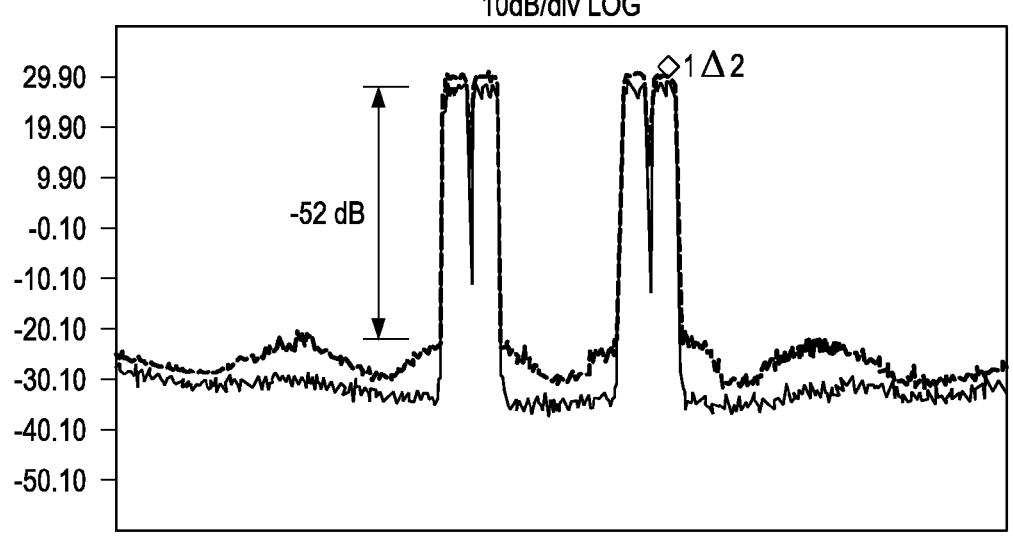
FIG. 10A is a spectral mask showing power amplifier distortion with delayed DPD compensation.
Figure 10B:
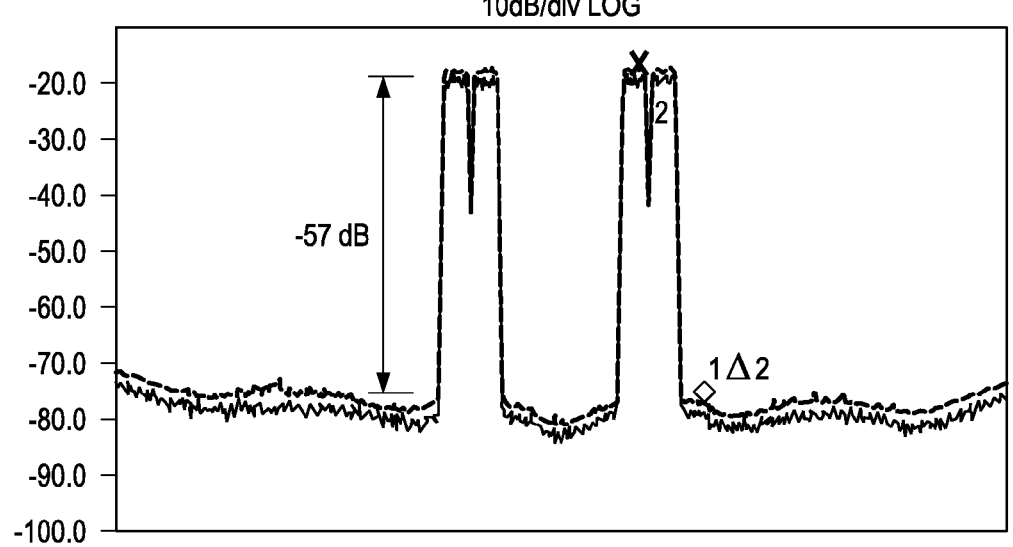
FIG. 10B is a spectral mask showing power amplifier distortion with separate fine and coarse DPD compensation according to the present invention.

At FIG. 10A, there is a spectral mask showing power amplifier distortion with delayed DPD compensation. Due to the computation time required to update an entire set of DPD parameters, the input signal can not be predistorted quickly enough to respond to rapid changes of input signal power, frequency, and semiconductor device temperature. Thus, a substantial amount of in-channel power spills over into adjacent channels so that the worst case (measured over time) adjacent channel power is approximately 52 dB below average in-channel power. By way of comparison, a spectral mask showing power amplifier distortion with dual loop DPD compensation of the present invention is illustrated at FIG. 10B. FDPD parameter updates on a relatively small first set of predistortion parameters are able to track rapid changes in the input signal. CDPD parameter updates on a substantially larger second set of predistortion parameters maintains accuracy without imposing a time consuming burden on computational resources. As a result, over time in the worst case only a relatively small amount of in-channel power spills over into adjacent channels so that adjacent channel power is approximately 57 dB below average in-channel. This is a 5 dB improvement over the spectral mask of FIG. 10A.

Still further, while numerous examples have thus been provided, one skilled in the art should recognize that various modifications, substitutions, or alterations may be made to the described embodiments while still falling with the inventive scope as defined by the following claims. Other combinations will be readily apparent to one of ordinary skill in the art having access to the instant specification.

What is claimed is:

1. A transmitter circuit comprising:
   a digital input lead coupled to a digital input signal;
   modulation circuitry having an input connected to the digital input lead and having a modulation output;
   crest factor reduction circuitry having an input connected to the modulation output and having an crest factor reduction output;
   digital predistortion circuitry having an input lead connected to the crest factor reduction output, the digital predistortion circuitry including:
      first digital predistortion circuitry having a digital input coupled to the input lead, a parameter input receiving a first set of predistortion parameters, and a first predistorted digital output;
      second digital predistortion circuitry having a digital input coupled to the first digital output, a parameter input receiving a second set of predistortion parameters, and a second predistorted digital output;
      first adaption circuitry having a first error input and having a parameter output coupled with the parameter input of the first digital predistortion circuitry; and
      second adaption circuitry having a second error input and having a parameter output coupled with the parameter input of the second digital predistortion circuitry;
   digital to analog converter circuitry having an input connected to the second predistorted digital output and having an analog output;
   RF up converter circuitry having an input connected to the analog output and having a radio frequency output;
   power amplifier circuitry having a radio frequency input connected to the radio frequency output and having a transmitter output;
   attenuation circuitry having a transmitter input connected to the transmitter output and having an attenuated output;
   RF down converter circuitry having an attenuated input connected to the attenuated output and having an analog feedback signal output;
   post process circuitry having an analog feedback signal input connected to the analog feedback signal output and having a corrected feedback signal output connected with the first error input and with the second error input.

2. The transmitter circuit of claim 1 including first trigger circuitry having an input coupled to the digital input lead and a first trigger output, and in which the first digital predistortion circuitry has a trigger input coupled to the first trigger output.

3. The transmitter circuit of claim 1 including second trigger circuitry having an input coupled to the output of the first digital predistortion circuitry and a second trigger output, and in which the second digital predistortion circuitry has a trigger input coupled to the second trigger output.

4. The transmitter circuit of claim 1 including first trigger circuitry having an input coupled to the digital input lead and a first trigger output, and second trigger circuitry having an input coupled to the output of the first digital predistortion circuitry and a second trigger output, and in which the first digital predistortion circuitry has a trigger input coupled to the first trigger output, and in which the second digital predistortion circuitry has a trigger input coupled to the second trigger output, the first trigger circuitry producing an output signal on the first trigger output more frequently than the second trigger circuitry produces an output signal on the second trigger output.

5. The transmitter circuit of claim 1 including first delay circuitry having an input coupled to the input lead and a first delay output, and including first summing circuitry having a positive input coupled to the first delay output, a negative input coupled to the output lead, and a first error output coupled to the first error input.

6. The transmitter circuit of claim 1 including second delay circuitry having an input coupled to the output of the first digital predistortion circuitry and a second delay output, and including second summing circuitry having a positive input coupled to the second delay output, a negative input coupled to the output lead, and a second error output coupled to the second error input.

7. The transmitter circuit of claim 1 in which the second digital predistortion circuitry receives a second set of predistortion parameters larger than the first set of predistortion parameters received by the first digital predistortion circuitry.

8. The transmitter circuit of claim 1 including modulation circuitry and crest factor reduction circuitry coupling the input lead to the digital input of the first digital predistortion circuitry.

9. The transmitter circuit of claim 1 including digital to analog circuitry, RF UP circuitry, and power amplifier circuitry coupling the output of the second digital predistortion circuitry to the output lead.

10. The transmitter circuit of claim 1 including attenuation circuitry, RF DN circuitry and analog to digital circuitry coupling the output lead to the first error input and the second error input.

* * * * *